United States Patent
Lytle et al.

(10) Patent No.: US 6,181,162 B1
(45) Date of Patent: Jan. 30, 2001

(54) PROGRAMMABLE LOGIC DEVICE WITH HIGHLY ROUTABLE INTERCONNECT

(75) Inventors: Craig S. Lytle, Mountain View; Kerry S. Veenstra, San Jose, both of CA (US)

(73) Assignee: Altera Corporation, San Jose, CA (US)

(*) Notice: Under 35 U.S.C. 154(b), the term of this patent shall be extended for 0 days.

(21) Appl. No.: 09/003,261

(22) Filed: Jan. 6, 1998

Related U.S. Application Data

(63) Continuation of application No. 08/838,398, filed on Apr. 3, 1997.
(60) Provisional application No. 60/014,942, filed on Apr. 5, 1996, and provisional application No. 60/015,122, filed on Apr. 10, 1994.

(51) Int. Cl.$^7$ ............................................. H01L 25/00
(52) U.S. Cl. .................................. 326/41; 326/47
(58) Field of Search .................... 326/37, 39, 41, 326/47, 40

(56) References Cited

U.S. PATENT DOCUMENTS

| | | |
|---|---|---|
| Re. 34,363 | 8/1993 | Freeman .......................... 307/465 |
| 3,473,160 | 10/1969 | Wahlstrom ........................ 340/175.5 |
| 4,020,469 | 4/1977 | Manning ............................ 340/172 |

(List continued on next page.)

FOREIGN PATENT DOCUMENTS 1444084  7/1976 (GB) ........................... H03K/19/00

OTHER PUBLICATIONS

Minnick, Survey of Microcellular Research, Journal of ACM, Apr. 1967.
Nichols, A Logical Next Step for Read–Only Memories, Electronics, Jun. 1967.
Wahlstrom, Programmable Logic Arrays—Cheaper by the Millions, Electronics, Dec. 1967.
Shoup, Programmable Cellular Logic Arrays, Carnegie Mellon Ph.D. Thesis, Mar. 1970.
Fleisher, The Writeable Personalized Chip, Computer Design, Jun. 1970.
Mukhopadhyay, Recent Deveolopments in Switching Theory, Academic Press, 1970.
Heutink, Implications of Busing for Cellular Arrays, Computer Design, Nov. 1974.
AT&T Microelec. Advance Data Sheet, Optimized Reconfigurable Cell Array (ORCA) Series Field–Programmable Gate Arrays, Feb. 1993.
Benes, V.E., *Mathematical Theory of Connecting Networks and Telephone Traffic*, Chapter 3: Rearrangeable Networks, Academic Press, Inc., 1965, pp. 82–135.

*Primary Examiner*—Michael Tokar
*Assistant Examiner*—James H Cho
(74) *Attorney, Agent, or Firm*—Townsend and Townsend and Crew LLP

(57) ABSTRACT

A programmable logic device architecture with a highly routable programmable interconnect structure. The arrangement of the logic array blocks (LABs), programmable interconnect structure, and other logical elements forms a Clos network. After specific constraints have been met, the architecture is guaranteed to route. The architecture is provably routable when there is no fan-out in the middle stage. A LAB (200) comprises an input multiplexer region (504), logic elements (300), input-output pins (516), and output multiplexer region (508).

10 Claims, 6 Drawing Sheets

U.S. PATENT DOCUMENTS

| | | | |
|---|---|---|---|
| 4,124,899 | 11/1978 | Birkner | 364/716 |
| 4,417,245 | 11/1983 | Melas et al. | 340/825.8 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra et al. | 307/465 |
| 4,706,216 | 11/1987 | Carter | 365/94 |
| 4,713,792 | 12/1987 | Hartmann et al. | 364/900 |
| 4,717,912 | 1/1988 | Harvey | 340/825.8 |
| 4,823,278 | 4/1989 | Kikuchi et al. | 364/491 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,036,473 | 7/1991 | Butts | 364/489 |
| 5,109,353 | 4/1992 | Sample et al. | 364/578 |
| 5,121,006 | 6/1992 | Pedersen et al. | 307/465 |
| 5,155,858 | 10/1992 | DeBruler et al. | 395/800 |
| 5,179,551 | 1/1993 | Turner | 370/60 |
| 5,241,224 | 8/1993 | Pedersen et al. | 307/465 |
| 5,260,610 | 11/1993 | Pedersen et al. | 307/465 |
| 5,260,611 | 11/1993 | Cliff et al. | 307/465 |
| 5,276,425 | 1/1994 | Swanson et al. | 340/826 |
| 5,329,470 | 7/1994 | Sample et al. | 364/578 |
| 5,336,950 | 8/1994 | Popli et al. | 307/465 |
| 5,350,954 | 9/1994 | Patel et al. | 307/465 |
| 5,352,123 | 10/1994 | Sample et al. | 439/61 |
| 5,448,496 | 9/1995 | Butts et al. | 364/489 |
| 5,452,231 | 9/1995 | Butts et al. | 364/489 |
| 5,452,239 | 9/1995 | Dai et al. | 703/19 |
| 5,455,525 * | 10/1995 | Ho et al. | 326/41 |
| 5,477,475 | 12/1995 | Sample et al. | 716/16 |
| 5,495,476 | 2/1996 | Kumar | 370/54 |
| 5,598,318 | 1/1997 | DeWitt et al. | 361/683 |
| 5,612,891 | 3/1997 | Butts et al. | 716/16 |
| 5,644,515 | 7/1997 | Sample et al. | 703/23 |
| 5,657,241 | 8/1997 | Butts et al. | 716/16 |
| 5,661,662 | 8/1997 | Butts et al. | 716/16 |
| B1 4,617,479 | 9/1993 | Hartmann et al. | 307/465 |

* cited by examiner

PROGRAMMABLE LOGIC DEVICE WITH HIGHLY ROUTABLE INTERCONNECT

This application is a continuation of U.S. patent application Ser. No. 08/838,398, filed Apr. 3, 1997, which claims the benefit of U.S. Provisional Applications Numbers 60/014,942, filed Apr. 5, 1996, and 60/015,122, filed Apr. 10, 1994, all of which are incorporated herein by reference.

BACKGROUND OF THE INVENTION

The present invention relates to the field of programmable logic integrated circuits. More specifically, the present invention provides an enhanced programmable logic architecture, improving upon the composition, configuration, and arrangements of logic array blocks and logic elements and also the interconnections between these logic array blocks and logic elements.

Programmable Logic Devices (PLDs) are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, MAX® 5000, MAX® 7000, FLEX® 8000, and FLEX® 10K families of devices made by Altera Corp.

PLDs are generally known in which many logic array blocks (LABs) are provided in a two-dimensional array. Further, PLDs have an array of intersecting signal conductors for programmably selecting and conducting logic signals to, from, and between the logic array blocks. LABs contain a number of relatively elementary logic individual programmable logic elements (LEs) which provide relatively elementary logic gates such as NAND, NOR, and exclusive OR gates.

Resulting from the continued scaling and shrinking of semiconductor device geometries, which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks. In particular, it is important to provide enough interconnection resources between the programmable logic elements so that the capabilities of the logical elements can be fully utilized and so that complex logic functions (e.g., requiring the combination of multiple LABs and LEs) can be performed, without providing so much interconnection resources that there is a wasteful excess of this type of resource.

While such devices have met with substantial success, such devices also meet with certain limitations, especially in situations in which the provision of additional or alternative types of interconnections between the logic modules would have benefits sufficient to justify the additional circuitry and programming complexity. Such additional interconnection paths may be desirable for making frequently needed kinds of interconnections, for speeding certain kinds of interconnections, for allowing short distance connections to be made without tying up more general purpose and therefore long distance interconnection resources, etc. There is also a continuing demand for logic devices with larger capacity. This produces a need to implement logic functions more efficiently and to make better use of the portion of the device which is devoted to interconnecting individual logic modules.

As can be seen, an improved programmable logic array integrated circuit architecture is needed, especially an architecture providing additional possibilities for interconnections between the logic modules and improved techniques for organizing and interconnecting the programmable logic elements, including LABs and LEs.

SUMMARY OF THE INVENTION

The present invention is a programmable logic device architecture with a highly routable programmable interconnect structure. The arrangement of the logic array blocks (LABs), programmable interconnect structure, and other logical elements forms a Clos network. In one embodiment, the present invention implements a three-stage Clos network.

After specific constraints have been met, the architecture is guaranteed to route. The architecture is provably routable when there is no fan-out in the middle stage. Provable routability refers to a condition where it has been mathematically shown, as long as certain constraints have been satisfied, that a signal at any input at the first stage may be routed to any output at the third stage.

A LAB of the present invention comprises an input multiplexer region (IMR), logic elements, input-output pins, and output multiplexer region (OMR). The PLD of the present invention implements a Clos network in the directions of the programmable global horizontal interconnect (row) and programmable global vertical interconnect (column).

More specifically, for the row interconnect, the OMR implements a full crossbar switch for the first stage of a Clos network. Multiplexers in a programmable global horizontal interconnect form a second stage. And, the IMR implements a full crossbar switch for a third stage of a Clos network. For the column interconnect, the IMR implements a first stage of a Clos network. Multiplexers in the programmable global vertical interconnect form a second stage. And, the OMR forms a third stage of a Clos network.

In accordance with the teachings of the present invention, a logic array block for a programmable logic device is disclosed, which includes: a plurality of logic elements, where the logic elements are programmably configurable to implement logical functions; an input multiplexer region, which programmably couples a plurality of global horizontal conductors to inputs of the logic elements; and an output multiplexer region, which programmably couples outputs of the logic elements to the plurality of global horizontal conductors.

Other objects, features, and advantages of the present invention will become apparent upon consideration of the following detailed description and the accompanying drawings, in which like reference designations represent like features throughout the figures.

DESCRIPTION OF THE PREFERRED EMBODIMENT

Figure 1:
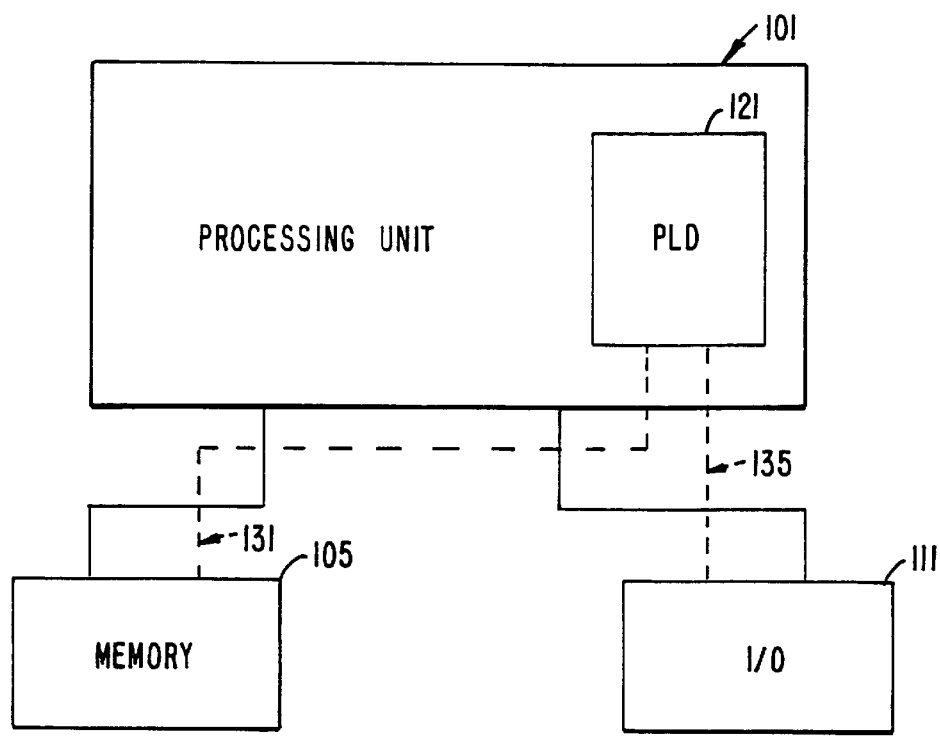
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card Flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
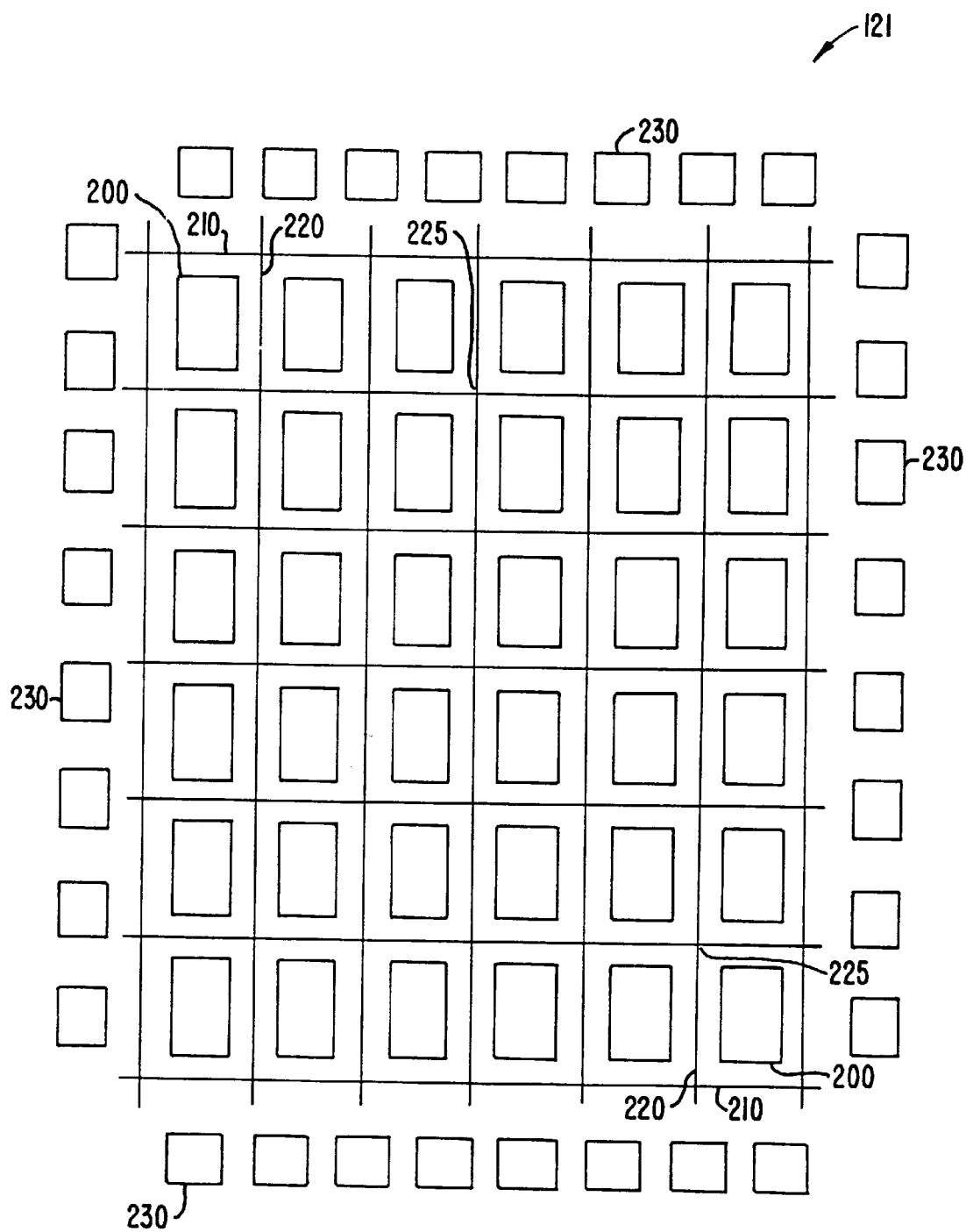
FIG. 2 is a block diagram showing the overall architecture of a programmable logic device.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Generally, in the future, as technology advances and improves, programmable logic devices with even greater numbers of logic array blocks will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments of the present invention, only selected GH 210 conductors are programmably connectable to a selection of GV 220 conductors. Furthermore, in still further embodiments, GH 210 and GV 220 conductors may be specifically used for passing signals in a specific direction, such as input or output, but not both.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. An input driver takes signals from outside the chip and interfaces them to on-chip circuitry. An output drive takes internal signals and interfaces them to the outside world. A bidirectional driver performs the functions of both a input driver and an output driver. In addition, a bidirectional drive has a high-impedance mode which allows the driver to interface with a bidirectional bus. In other embodiments of the present invention, a PLD may have dedicated input drivers and dedicated output driver, as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3:
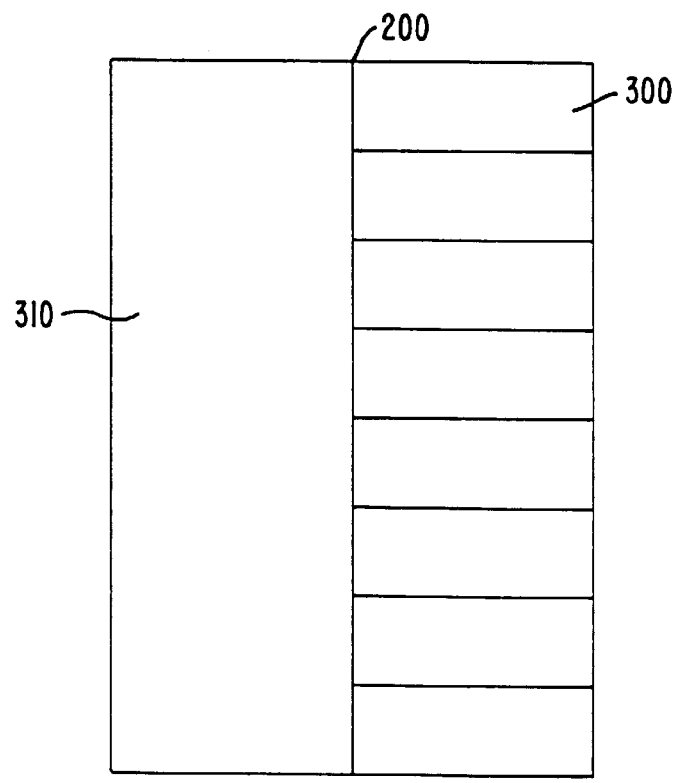
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A more detailed description of LE 300 of the present invention is given below in connection with FIG. 4. A general overview is presented here, sufficient to provide a basic understanding of LAB 200. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 4:
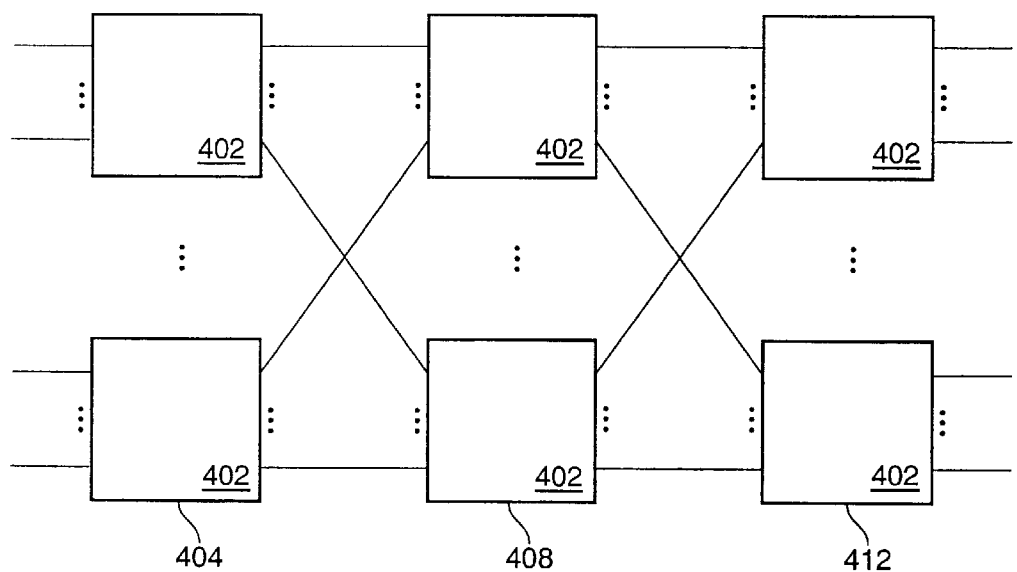
FIG. 4 is a diagram of a Clos network.

FIG. 4 is a diagram of a three-stage Clos network. Only a brief overview of Clos network theory is presented here, sufficient for an understanding of the present invention. A detailed discussion of a Clos network theory is presented in chapter 3 of V. E. Benes, *Mathematical Theory of Connecting Networks and Telephone Traffic* (1965), and is incorporated herein by reference.

In FIG. 4, the Clos network is comprised of crossbar switches 402. A crossbar switch 402 has a plurality of inputs and a plurality of outputs. A crossbar switch 402 routes its inputs to any of its outputs. A first stage 404 of crossbar switches 402 is coupled through a second (or middle) stage 408 of crossbar switches 402 to a third stage 412 of crossbar switches 402. There are r crossbar switches in the first stage 404 and third stage 412. Each crossbar switch 402 in the first stage has n inputs. Each crossbar switch 402 in the third stage 412 has n outputs. There are m crossbar switches 402 in second stage 408. An input to a crossbar switch 402 may be routed to or control multiple outputs of that crossbar; this is referred to as "fan-out."

In a three-stage Clos network, the Clos network provides "provable routability" when there is no fan-out in the middle stage. This condition is expressed mathematically as $m \geq 2n-1$. Provable routability refers to a condition where it has been mathematically shown that a signal at any input at the first stage 404 may be routed to any output at the third stage 412. Every output will be coupleable to every input, and vice versa. More specifically, signals coupled to first-stage crossbar switches 404 will be coupleable to outputs of third-stage crossbar switches 412 if there is no fan-out in the middle stage.

Essentially, Clos network theory enables the design of switching networks with provable routability, with a minimum of crossbar switches 402. As applied to programmable logic, Clos network theory provides a technique for minimizing the interconnect and other resources, but still permitting substantial routability and utilization of those resources. Therefore, Clos network theory enables the design of architectures with substantially a minimum of interconnect resources and other resources, but still allowing substantial routability. Furthermore, taking into consideration Clos network theory, the programming of programmable logic integrated circuits is made simpler since signals are provably routable.

Although for provable routability, there should be no fan-out in the middle stage, this can still be useful for PLDs because the first and third stages may be used for the fan-out of signals.

Figure 5:
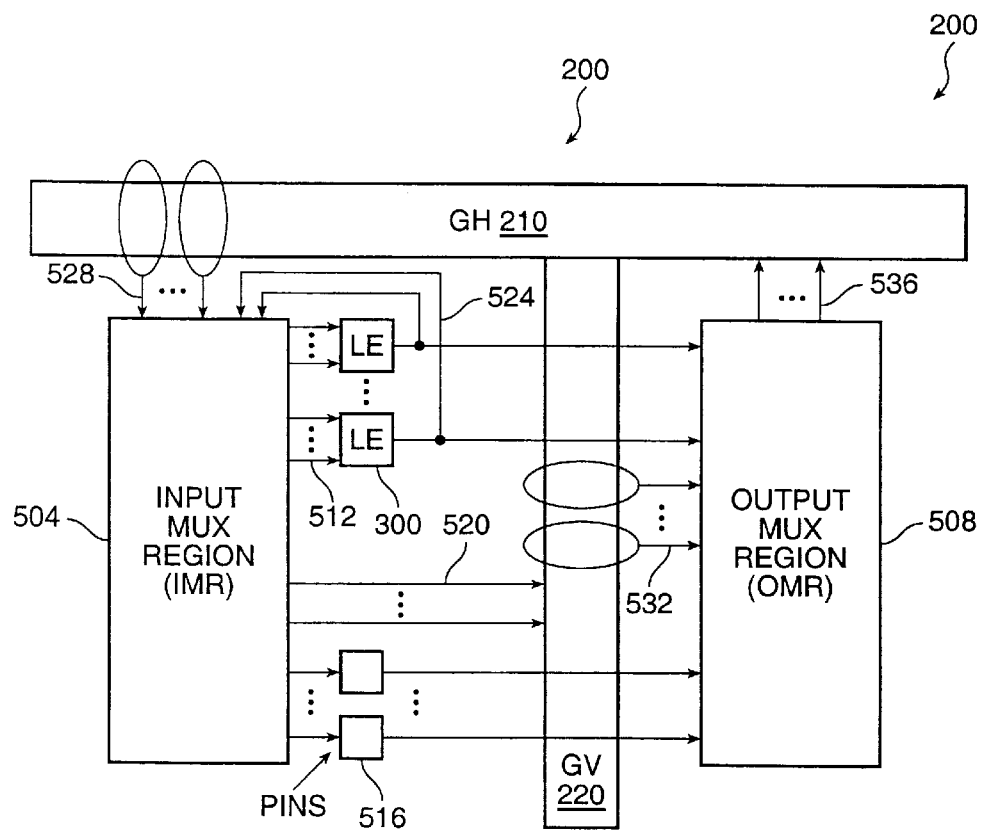
FIG. 5 is a diagram of a logic array block of the present invention.

FIG. 5 is a diagram of LAB 200 of the present invention. This embodiment of LAB 200 uses a Clos network as a basic routing structure. Many details of PLD architecture, organization, and circuit design are not necessary for an understanding of the present invention and such details are not shown in FIG. 5. In order to implement a Clos network, LAB 200 has an input multiplexer region (IMR) 504 and an output multiplexer region (OMR) 508. A Clos network is implemented for LABs 200 in the GH 210 direction (a row direction) and the GV 220 direction (a column direction). In the row direction, OMR 508 is a first stage of a Clos network; GH 210 is a middle stage; and IMR 504 is a third stage. In the column direction, IMR 504 is a first stage of a Clos network; GV 220 is a middle stage; and OMR 508 is a third stage.

IMR 504 and OMR 508 are programmable interconnect regions. IMR 504 programmably routes and couples signals from the outputs of LEs 300 (via conductors 524) and from GHs 210 (via conductors 528). IMR 504 programmably couples these signals to the inputs of LEs 300 (via conductors 512), input-output pins 516, and GVs 220 (via conductors 520). For example, a signal from other LABs 200 may be coupled through GH 210 and IMR 504 to LEs 300 of this LAB. In this fashion, a plurality of LABs and LEs may be combined to form more complex logical functions. Furthermore, via IMR 504, signals from GH 210 and the outputs of LEs 300 may be programmably coupled to GV 220. Also, outputs from LEs 300 may be fed back into IMR 504 to programmably couple to the inputs of other LEs 300 within the same LAB 200. In this respect, IMR 504 is similar to local interconnect structure 310 of FIG. 3. IMR 504 allows short-distance interconnection of LEs 300 within a LAB 200, without utilizing the limited global resources, such as GHs 210 and GVs 220.

Moreover, IMR 504 also permits driving input-output pins 516 directly. Input-output pins 516 are used to communicate signals to and from sources external to the PLD. To drive circuits external to the integrated circuit, the LAB 200 of the present invention does not require using global interconnection resources to programmably couple signals to input-output drivers 230 (as shown in FIG. 2). Outputs of LEs 300 may be programmably coupled through IMR 504 to input-output pins 516 directly without utilizing the global resources.

GHs 210 may be coupled to IMR 504 via fully, half-, or partially populated multiplexing. In a fully populated multiplexing scheme, all GHs 210 may be programmably coupled to IMR 504. In a half-populated multiplexing scheme, a selected half of the GHs 210 may be programmably coupled to IMR 504. Partially populated multiplexing allows selected GHs 210 to be programmably coupled to IMR 504. For example, in one embodiment, only a selected three GHs 210 out of five may be programmably coupled to IMR 504. Half- and partially populated multiplexing require fewer programmable connections than fully populated multiplexing. Therefore, half- and partially populated multiplexing result in reduced integrated circuit die sizes. In a specific embodiment, GHs 210 are coupled to IMR 504 through fully populated multiplexing.

OMR 508 programmably routes and couples signals from the outputs of LEs 300 (via conductors 524), input-output pins 516, and GVs 220 (via conductors 532). OMR 508 programmably couples these signals to GHs 210 (via conductors 536). For example, via OMR 508, the outputs of LEs 300 may be programmably coupled to GHs 210. Via OMR 508 and GHs 210, one LAB may be programmably coupled to other LABs to create more complex logic functions. Also, input-output pins 516 may be programmably coupled through OMR 508 to GHs 210 for routing elsewhere on the integrated circuit. Consequently, input-output pins 516 may drive LABs 200 directly without utilizing input-output drivers 230 (shown in FIG. 2).

Signals from GVs 220 may be programmably coupled through OMR 508 to GHs 210. GVs 220 may be coupled to OMR 508 via fully, half-, or partially populated multiplexing. In a fully populated multiplexing scheme, all GVs 220 may be programmably coupled to OMR 508. In a half-populated multiplexing scheme, a selected half of the GVs 220 may be programmably coupled to OMR 508. Partially populated multiplexing allows selected GVs 220 to be programmably coupled to OMR 508. For example, in one embodiment, only a selected three GVs 220 out of five may be programmably coupled to OMR 508. Half- and partially populated multiplexing require fewer programmable connections than fully populated multiplexing. Therefore, the use of half- and partially populated multiplexing result in reduced integrated circuit die sizes. In a specific embodiment, GVs 220 are coupled to OMR 508 through fully populated multiplexing.

Figure 6:
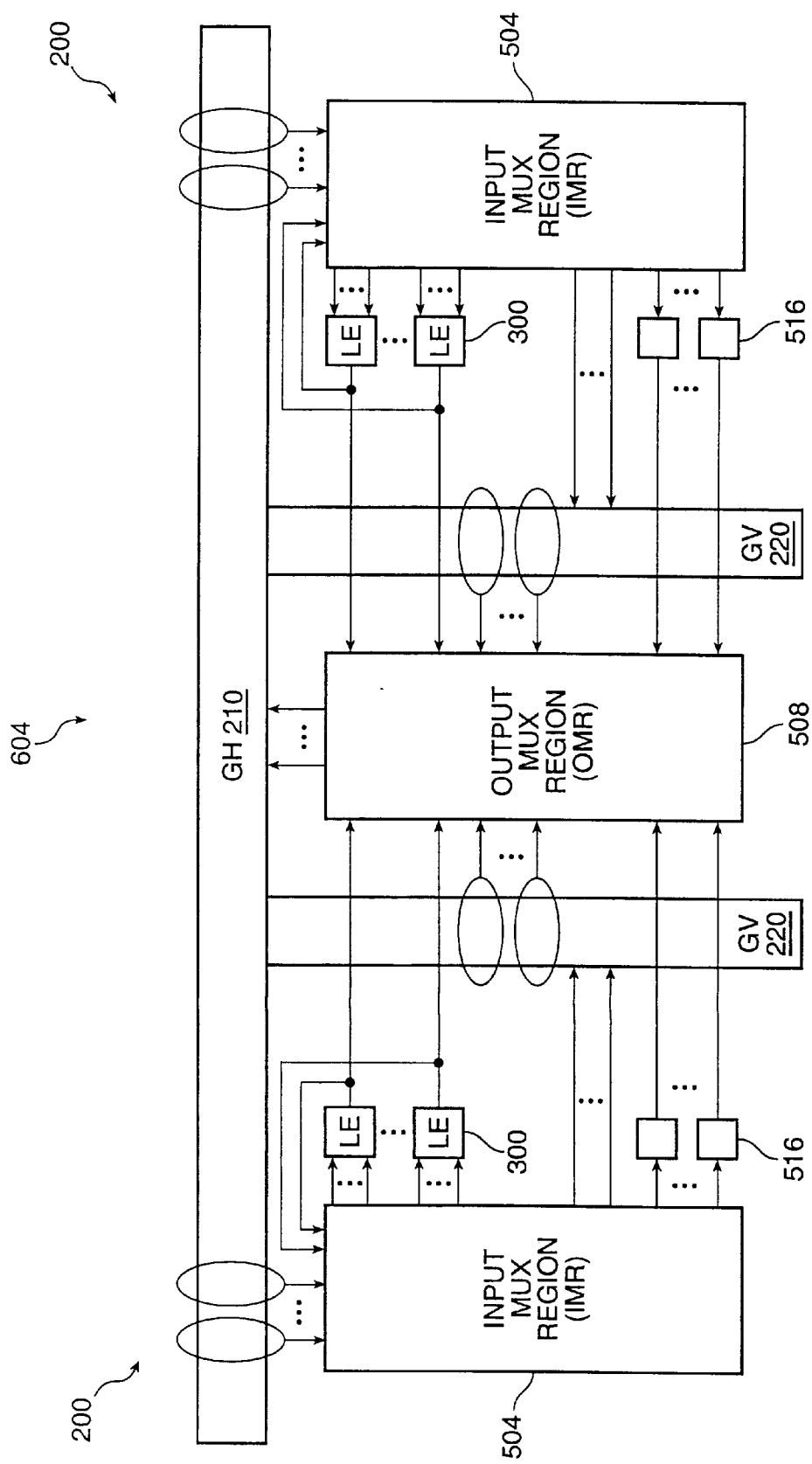
FIG. 6 is a diagram of a logic array block pair of the present invention.

FIG. 6 is a diagram of a pair of LABs 200 of the present invention. A LAB 200 of FIG. 6 is similar to LAB 200 of FIG. 5. However, in a LAB pair of FIG. 6, one OMR 508 is shared between two LABs 200. LABs 200 of FIG. 6 share many similarities with FIG. 5. Furthermore, many of the connections between GHs 210, GVs 220, IMRs 504, OMR 508, and other components are similar to that described in FIG. 5 above. This discussion will primarily focus on the differences in FIG. 6 from what has already been described for FIG. 5.

In FIG. 6, a single OMR 508 is shared between two LABs 200. These two LABs 200 form a LAB pair 604. More specifically, from a first LAB 200, outputs of LE 300, GVs 220, and input-output pins 516 may be programmably coupled through OMR 508 to GHs 210. Similarly, from a second LAB 200, outputs of LE 300, GVs 220, and input-output pins 516 may be programmably coupled through the same OMR 508 to GHs 210. Furthermore, GVs 220 from LABs 200 may be coupled to OMR 508 via fully, half-, or partially populated multiplexing (also described above). After OMR 508 programmably couples signals to GHs 210, these signals may be, in turn, programmably coupled to other LABs 200.

The LABs in FIGS. 5 and 6 implement a three-stage Clos network. Moreover, the present invention implements a three-stage Clos network in two dimensions, in the direction of GHs 210 (row direction) and in the direction of GVs 220 (column direction). In the row direction, OMRs 508 (from a plurality of LABs 200 associated with this row) are the first stage of the Clos network. The middle stage of the Clos network is implemented by this row which are used to programmably couple these signals to IMRs 504. The third stage of the Clos network is implemented by the IMRs 504 (from a plurality of LABs associated with this GH 210). A Clos network is also implemented in the column direction. IMRs 504 are the first stage. GV multiplexers are the second stage. And, OMRs 508 are the third stage of the Clos network.

The implementation of a Clos network as shown in FIGS. 5 and 6 may be considered a superset of a Clos network. In a Clos network, as shown in FIG. 4, the number of inputs into a crossbar switch 402 is equal to the number of outputs. In FIGS. 5 and 6, this is also the case. However, these implementations also have additional inputs and outputs for LEs 300 and input-output pins 516. These provide additional resources providing additional functionality, which is routable using Clos network resources. The implementation in FIGS. 5 and 6 provide programmable resources and Clos network routability in a compact structure. This structure facilitates a compact layout for an integrated circuit.

The sources and destinations, which are the inputs and outputs, of the Clos network are the same. In FIGS. 5 and 6, the sources of signals are LEs, GVs, and pins and the destinations are also LEs, GVs, and pins. The implementation in FIG. 6 is useful for easily organizing a structure so that the number of inputs into GH 210 from OMR 508 equals the numbers of outputs from GH 210 into IMRs 504. GH 210 in this case represents a second stage of the Clos network. The middle crossbar switch in a Clos network should have equal numbers of inputs and outputs. The structure in FIG. 6 provides this feature of a Clos network in a flexible, feature-rich form, without unnecessary complexity or resources.

In a specific embodiment of a PLD architecture implementing a Clos network, there are ten rows and thirty-six columns. A LAB 200 (one of a LAB pair) contains eight LEs 300, two input-output pins 516, three IMR 504 connections to GVs 220, three connections from GVs 220 to OMR 508. In a row, there are 36 LABs and consequently, 432 programmable conductors. IMR 504 of LAB 200 is programmably coupled to twenty-four GH conductors. In a column, there are ten LABs 200. GV 220 has thirty programmable conductors for programmably coupling to LAB 200.

Figure 7:
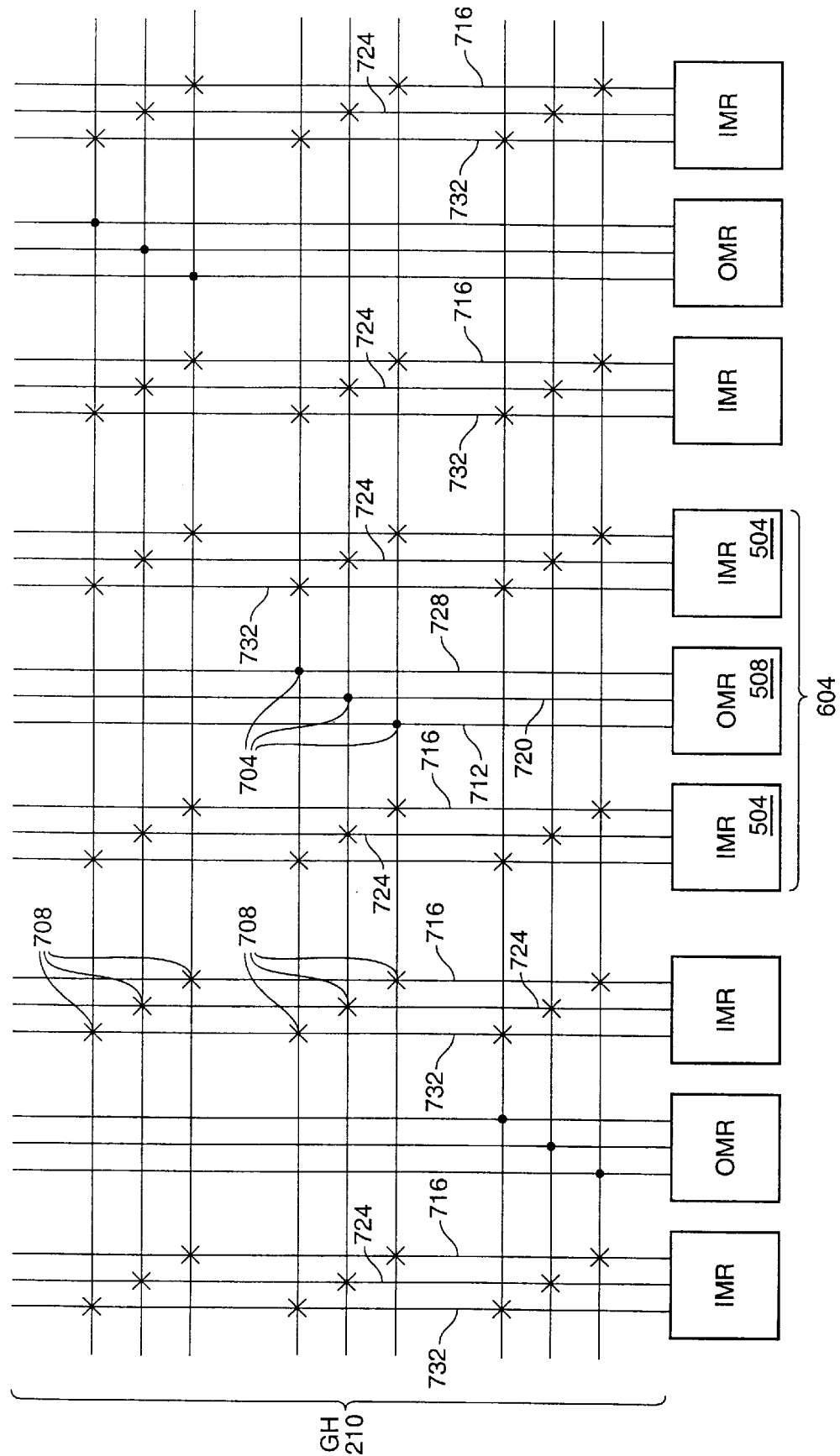
FIG. 7 is a diagram of the connections of a logic array block pair to the GH interconnect.

FIG. 7 is a more detailed diagram of the GH 210 interconnection resources of the present invention. FIG. 7 illustrates how LAB pairs 604 are programmably coupled to GH 210. FIG. 7 also shows how a LAB 200 the present invention implements a Clos network along GHs 210. Many details of PLD architecture, organization, and circuit design are not necessary for an understanding of the present invention and such details are not shown in FIG. 7.

Three LAB pairs 604 are shown in FIG. 7, but in other embodiments, there may be any number of LAB pairs 604 along a GH 210. OMR 508 is directly coupled to three conductors (704) in GH 210. Since there are three OMRs 508, FIG. 7 shows nine GH 210 conductors. In other embodiments, as the number of LABS 604 increases, the number of GH 210 increases accordingly. These three conductors may be programmably coupled through programmable connections 708 to IMRs 504. For example, a particular OMR 508 may be coupled to one or more IMRs 504 via programmable connections 708. More specifically, the GH 210 conductors to which an OMR 508 is coupled (via connections 704) may be programmably coupled via programmable connections 708 to the desired IMRs 504.

Programmable connections 708 may be implemented using memory cells such as DRAM, SRAM, EPROM, EEPROM, Flash, and antifuses. In a preferred embodiment of the present invention, programmable connections 708 use SRAM memory. Furthermore, programmable connections 708 may be implemented by way of programmable multiplexers.

Further, a first output 712 of OMR 508 may be programmably coupled via a GH 210 conductor and programmable connections 708 to first inputs 716 of IMRs 504. Similarly, a second output 720 of OMR 508 may be programmably coupled via a GH 210 conductor and programmable connections 708 to second inputs 724 of IMRs 504. And, a third output 728 of OMR 508 may be programmably coupled via a GH 210 conductor and programmable connections 708 to third inputs 732 of IMRs 504. This is similarly the case for other OMRs 508 and sets of GHs 210 along the same GH 210.

In effect, the first input 716 to IMR 504 forms a multiplexer which programmably selects from among the OMR 508 outputs which may be programmably coupled to first input 716. The second input 724 to IMR 504 also forms a multiplexer which programmably selects from among the OMR 508 outputs which may be programmably coupled to second input 724. And, the third input 732 to an IMR 504 also forms a multiplexer which programmably selects from among the OMR 508 outputs which may be programmably coupled to third input 732. Consequently, GHs 210 forms GH multiplexers. Outputs from OMR 508 may be viewed as inputs to these GH multiplexers (or GH multiplexer drivers). Inputs to IMR 504 may be viewed as outputs from these GH multiplexers.

The present invention implements a Clos network along GH 210. More specifically, GH 210 forms a three-stage Clos network. OMRs 508 are the first stage; the GH multiplexers are the second stage; and IMRs 504 are the third stage of the Clos network.

Figure 8:
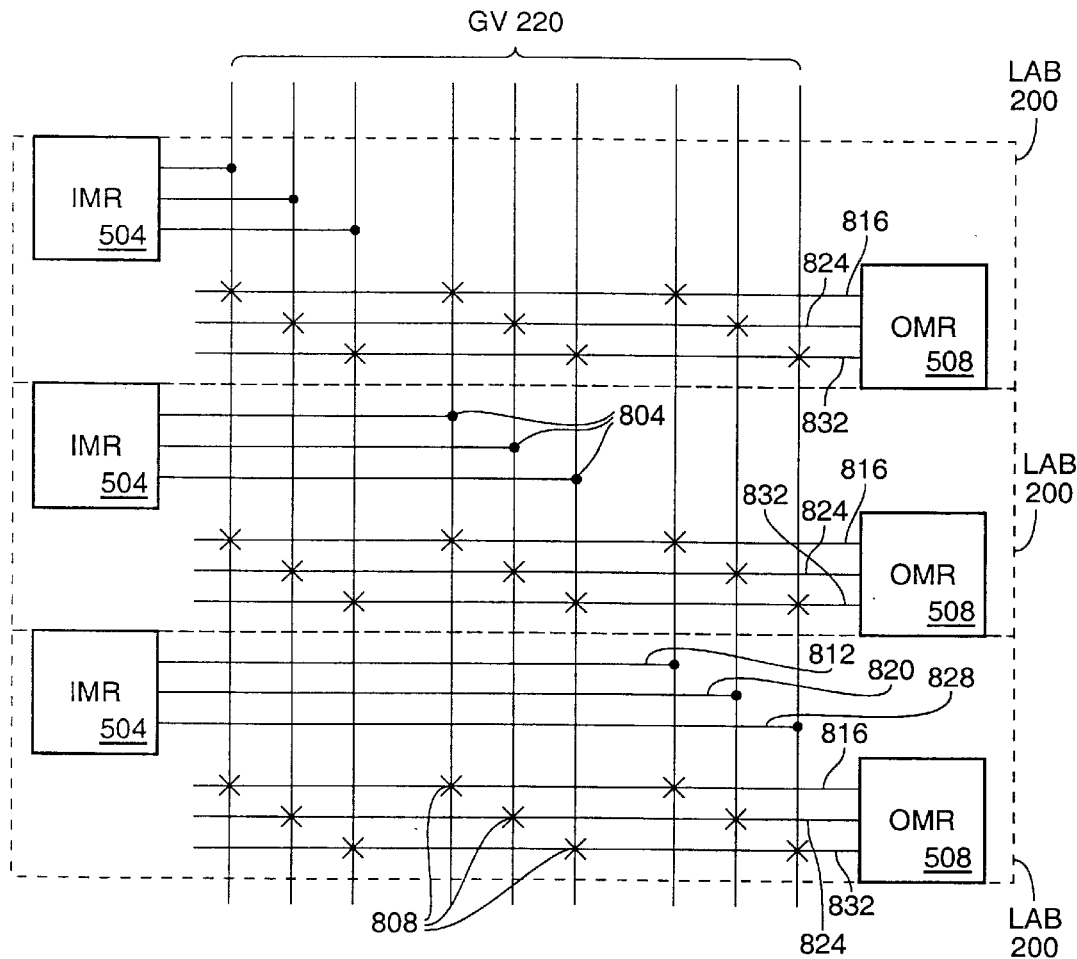
FIG. 8 is a diagram of the connections of a logic array block to the GV interconnect.

FIG. 8 is a more detailed diagram of the GV 220 interconnection resources of the present invention. FIG. 8 illustrates how LABs 200 are programmably coupled to GV 220. FIG. 8 also shows how a the present invention implements a Clos network along GV 220. Many details of PLD architecture, organization, and circuit design are not necessary for an understanding of the present invention and such details are not shown in FIG. 8.

Three LABs 200 are shown in FIG. 8, but in other embodiments, there may be any number of LABs 200 along a GV 210. In a specific embodiment, there are ten LABs 200 along a GV 210 of the PLD. IMR 504 is directly coupled to three conductors via connections 804 in GV 210. Since there are three IMRs 504, FIG. 8 shows nine GV 220 conductors. In other embodiments, as the number of LABs 200 increases, the number of GVs 220 increases accordingly. These three conductors may be programmably coupled through programmable connections 808 to IMRs 504. For example, a particular OMR 508 may be coupled to one or more OMRs 508 via programmable connections 808. More specifically, the GV 220 conductors to which an IMR 504 is coupled (via connections 804) may be programmably coupled via programmable connections 808 to the desired OMRs 508.

Programmable connections 808 may be implemented using memory cells such as DRAM, SRAM, EPROM, EEPROM, Flash, and antifuses. In a preferred embodiment of the present invention, programmable connections 808 use SRAM memory. Furthermore, programmable connections 808 may be implemented by way of programmable multiplexers. Via GVs 220 and the programmable resources described, LABs 200 may be programmably combined with other LABs 200 to form more complex logic functions.

Further, a first output 812 of IMR 504 may be programmably coupled via a GV 220 conductor and programmable connections 808 to first inputs 816 of OMRs 508. Similarly, a second output 820 of IMR 504 may be programmably coupled via a GV 220 conductor and programmable connections 808 to second inputs 824 of OMRs 508. And, a third output 828 of IMR 504 may be programmably coupled via a GV 220 conductor and programmable connections 808 to third inputs 832 of OMRs 508. This is similarly the case for other IMRs 504 along the same GV 220.

In effect, the first input 816 to OMR 508 forms a multiplexer which programmably selects from among the IMR 504 outputs which may be programmably coupled to first input 816. The second input 824 to OMR 508 also forms a multiplexer which programmably selects from among the IMR 504 outputs which may be programmably coupled to second input 824. And, the third input 832 to an OMR 504 also forms a multiplexer which programmably selects from among the IMR 504 outputs which may be programmably coupled to third input 832. Consequently, outputs from IMR 504 may be viewed as inputs to GV multiplexers (or GV multiplexer drivers). Inputs to OMR 508 may be viewed as outputs from these GV multiplexers.

The present invention implements a Clos network along GVs 220. More specifically, GVs 220 forms a three-stage Clos network. IMRs 504 are the first stage; the GV multiplexers are the second stage; and OMRs 508 are the third stage of the Clos network.

Figure 9:
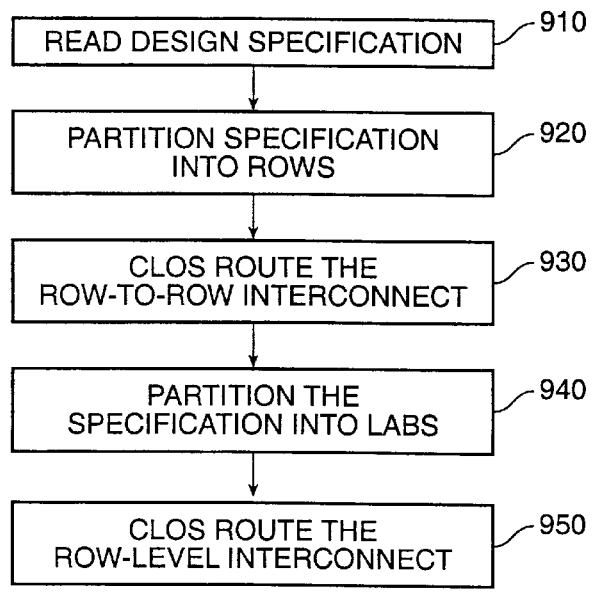
FIG. 9 is a flow diagram of a procedure for programming a programmable logic device of the present invention.
Figure 2:
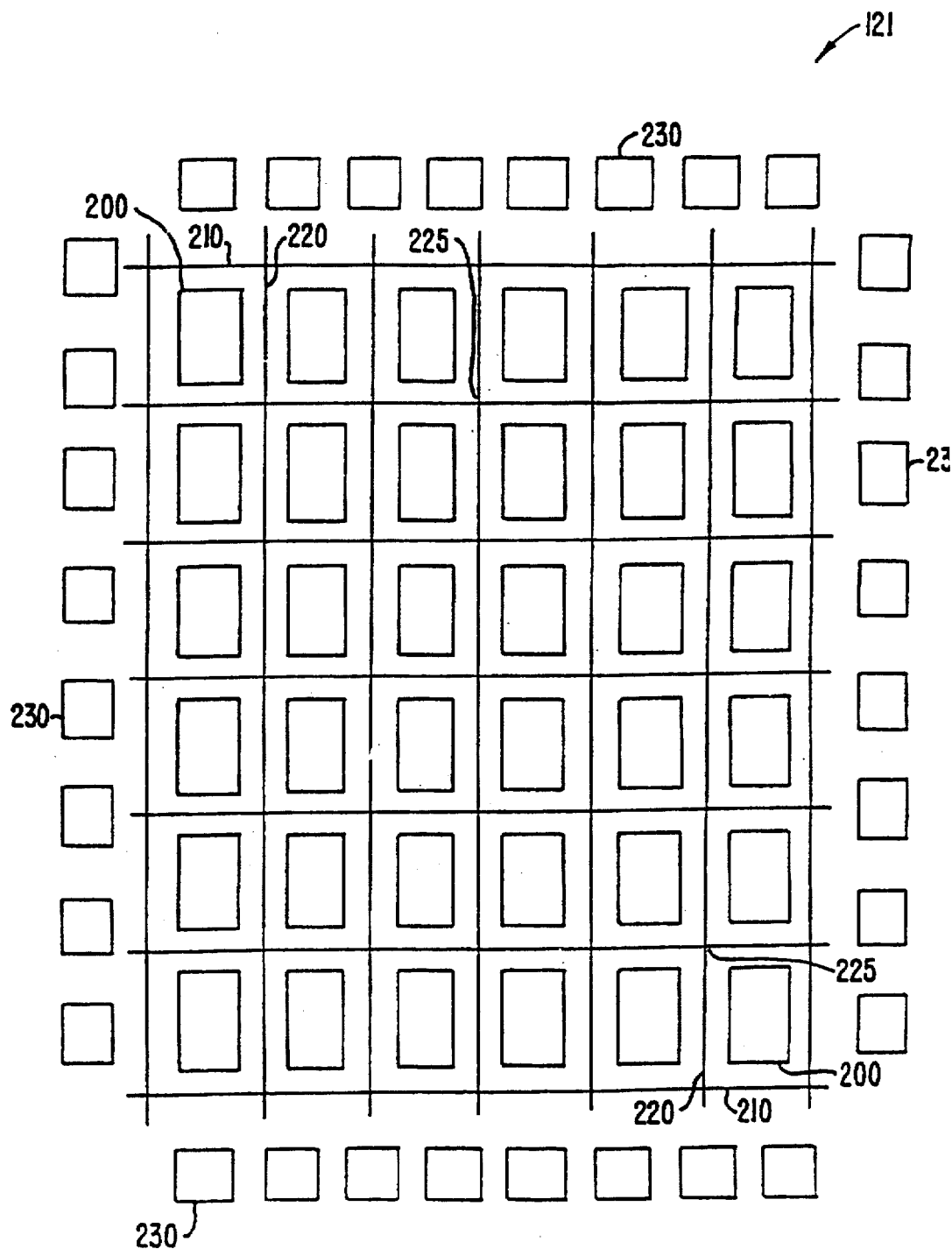

A PLD of the present invention may be programmed according to the procedure shown in the flow diagram in FIG. 9. The procedure in FIG. 9 may be performed on a general purpose computer, programmed digital computer, other computing machine specially adapted for programming design characteristics into a programmable logic device. For example, the flow diagram shown in FIG. 9 may be performed by the system described in FIG. 1.

A "read design specification" step 910 reads the specification of the design to be implemented into a programmable logic device. A design specification defines the boolean equations, logical functions, and other operations to be implemented into LEs 300 of PLD 121. This specification may have been previously defined by a user and may in part, be generated by a computer or other machine. This specification also includes the assignments for input-output pins 516. For example, a user may request a particular signal or signals to input or output from designated input-output pins 516. These requests are referred to as input-output pins 516 assignments. When programming PLD 121, these input-output pin 516 assignments will be taken into consideration.

A "partition specification into rows" step 920 partitions (divides) the boolean equations, logical functions, and other operations of the design specification among the rows of LABs 200 of PLD 121. Partition step 920 considers the numbers of signals routing into and out of this row. This process will introduce and utilize GV multiplexers and GV drivers when required.

Partition step 920 ensures provable routability of the column interconnect by dividing functions and operations so that the signals going between rows of LABs satisfies Clos theory constraints. More specifically, the row fan-in must be less than or equal to the total number of inputs of that row and the row fan-out must be less than or equal to the total number of outputs of that row. Fan-out is measured as the total number of rows that are driven by a given row. For example, if a row has 100 output signals, but 2 outputs from that row drive two different rows, then the total fan-out for that row is 102.

As a further example, in the case where a row has thirty-six LABs, each LAB having eight LEs 300, two input-output pins 516, three Gv drivers, and three GV multiplexers, the row fan-in must be less to or equal to 108 and the row fan-out must be less than or equal to 108.

A "Clos route the row-to-row interconnect" step 930 routes the interconnect and signals among the rows in PLD 121. Clos route step 930 will assign GV multiplexers and GV drivers into specific LABs, when necessary. If Clos theory constraints are satisfied during the partition step 920, Clos route step 930 is guaranteed to succeed; this means that all signals into and out of a row will be routable.

A "partition the specification into LABs" step 940 partitions the design specification and LEs 300 into LABs 200 for a row. Partition step 940 divides the boolean equations, logical functions, and other operations, which were previously allocated into rows, among LABs 200 of that particular row. Partition step 940 takes into consideration the input-output pin 516, GV driver, and GV multiplexer assignments made previously.

Partition step 940 ensures Clos routability of the row interconnect by dividing functions and operations so that the signals traversing between LABs 200 satisfies Clos theory constraints. More specifically, the LAB fan-in must be less than or equal to the total number of inputs of that LAB 200, and the LAB fan-out must be less than or equal to the total number of inputs of that LAB 200. Fan-out is measured by the total number of LABs 200 that are driven by OMR 508 of this LAB 200. For example, if an OMR 508 has twenty output signals, but two of them need to drive two different LABs, then the total fan out for this OMR is twenty-two.

As a further example, in the case where a row has thirty-six LABs, each LAB having eight LEs 300, two input-output pins 516, three GV drivers, and three GV multiplexers, the LAB fan-in must be less to or equal to twenty-four and the row fan-out must be less than or equal to twenty-four. Furthermore, in the case where LABs 200 share a common OMR 508 (e.g., a LAB pair 604), partition step 940 counts LAB 200 inputs independently while the LAB outputs are counted in a pair.

A "Clos route the row-level interconnect" step 950 routes the signals among LABs 200 in a row. If Clos theory constraints were satisfied in partition step 940, Clos route step 950 is guaranteed to succeed; this means that all signals into and out of a LAB of that row will be routable.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

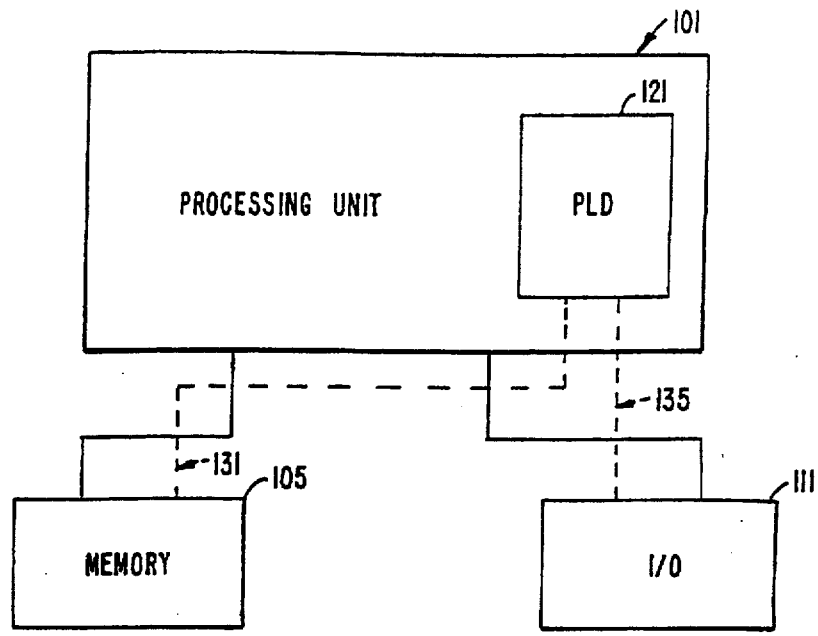
FIG. 1.
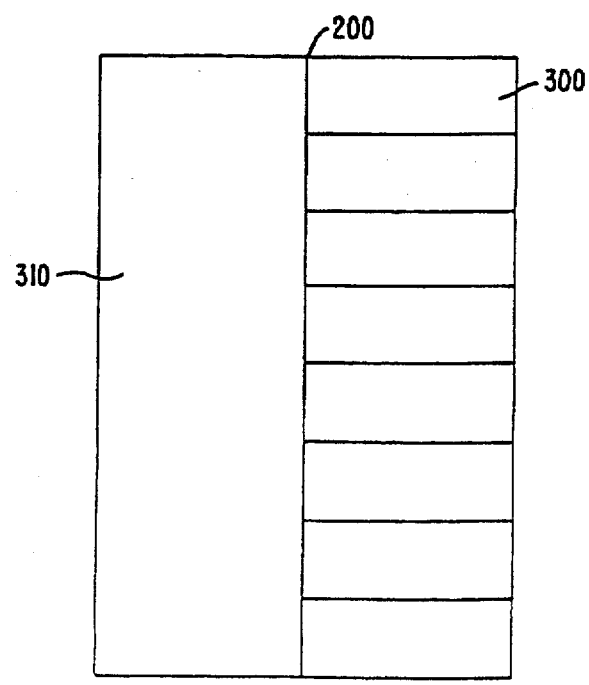

What is claimed is:

1. A programmable integrated circuit comprising:
   a first plurality of conductors, each of which extends along a first dimension of an array;
   a second plurality of conductors, each of which extends along a second dimension of said array, said second plurality of conductors programmably coupled to said first plurality of conductors; and
   a plurality of logic array blocks, wherein each logic array block comprises:
      a plurality of programmable logic elements, wherein a programmable logic element comprises at least one programmable logic element input and at least one programmable logic element output;
      an input multiplexer region for programmably coupling said first plurality of conductors to said programmable logic element inputs and said second plurality of conductors; and
      an output multiplexer region for programmably coupling said programmable logic element outputs and said second plurality of conductors to said first plurality of conductors,
      wherein a number of programmable connections between said input multiplexer region and said first plurality of conductors is about equal to a number of programmable connections between said output multiplexer region and said first plurality of conductors.

2. The programmable integrated circuit of claim 1 wherein said output multiplexer region programmably couples a pin of an integrated circuit to said first plurality of conductors.

3. The programmable integrated circuit of claim 1 wherein said input multiplexer region programmably couples said first plurality of conductors to a pin of an integrated circuit.

4. The programmable integrated circuit of claim 1 wherein said input multiplexer region programmably couples said programmable logic element outputs to each of said programmable logic element inputs and said second plurality of conductors.

5. The programmable integrated circuit of claim 1 wherein said input multiplexer region programmably couples said programmable logic element outputs, to a pin of an integrated circuit.

6. The programmable integrated circuit of claim 1 wherein said output multiplexer region programmably couples a pin of an integrated circuit to said second plurality of conductors through said input multiplexer region.

7. The programmable integrated circuit of claim 1 wherein said first input multiplexer region programmably couples said first plurality of conductors to a pin of an integrated circuit or one of said plurality of programmable logic elements.

8. The programmable integrated circuit of claim 1 wherein said input multiplexer region programmably couples each of said programmable logic elements outputs to each of said programmable logic element inputs and said second plurality of conductors.

9. The programmable integrated circuit of claim 1 wherein said programmable logic elements are substantially identical.

10. A programmable integrated circuit comprising:
    a first plurality of conductors, each of which extends along a first dimension of said two-dimensional array;
    a second plurality of conductors, each of which extends along a second dimension of said two-dimensional array, said second plurality of conductors programmably coupled to said first plurality of conductors; and
    a plurality of logic array block pairs, wherein each logic array block pair comprises:
       a first plurality of programmable logic elements, each programmable logic element having at least one programmable logic element input and at least one programmable logic element output;
       a second plurality of programmable logic elements, each programmable logic element having at least one programmable logic element input and at least one programmable logic element output;
       a first input multiplexer region for programmably coupling said first plurality of conductors to each of said first plurality of programmable logic element inputs and said second plurality of conductors;
       a second input multiplexer region for programmably coupling said first plurality of conductors to each of said second plurality of programmable logic element inputs and said second plurality of conductors; and
       an output multiplexer region for programmably coupling each of said first and second plurality of programmable logic element outputs and said second plurality of conductors to said first plurality of conductors,
    wherein a number of programmable connections between said second input multiplexer region and said first plurality of conductors is about equal to a number of programmable connections between said output multiplexer region and said first plurality of conductors.

\* \* \* \* \*

UNITED STATES PATENT AND TRADEMARK OFFICE
CERTIFICATE OF CORRECTION

PATENT NO. : 6,181,162 B1
DATED : January 30, 2001
INVENTOR(S) : Craig S. Lytle and Kerry S. Veenstra It is certified that error appears in the above-identified patent and that said Letters Patent is hereby corrected as shown below:

Drawings,
Sheet 1,
Figs. 1 and 3, the entire drawing sheet should be added; and

Sheet 2,
Fig. 2, the entire drawing sheet should be added.

Signed and Sealed this

Fifth Day of February, 2002

*Attest:*

JAMES E. ROGAN
*Attesting Officer*  *Director of the United States Patent and Trademark Office*